(12) United States Patent
Din et al.

(10) Patent No.: US 10,014,894 B2
(45) Date of Patent: *Jul. 3, 2018

(54) DOWN-CONVERSION CIRCUIT (71) Applicant: Telefonaktiebolaget LM Ericsson (publ), Stockholm (SE)

(72) Inventors: Imad Ud Din, Lund (SE); Stefan Andersson, Lund (SE); Henrik Sjoland, Lund (SE); Johan Wernehag, Malmo (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 15 days.

This patent is subject to a terminal disclaimer.

(21) Appl. No.: 15/139,941

(22) Filed: Apr. 27, 2016

(65) Prior Publication Data

US 2016/0241281 A1 Aug. 18, 2016

Related U.S. Application Data (63) Continuation of application No. 14/376,085, filed as application No. PCT/EP2013/051248 on Jan. 23, 2013, now Pat. No. 9,356,634.

(Continued)

(30) Foreign Application Priority Data

Feb. 3, 2012 (EP) .................................... 12153826

(51) Int. Cl.
*H03D 1/04* (2006.01)
*H03D 1/06* (2006.01)
(Continued)

(52) U.S. Cl.
CPC ........... *H04B 1/109* (2013.01); *H03D 7/1441* (2013.01); *H03D 7/1458* (2013.01);
(Continued)

(58) Field of Classification Search
CPC ......... H03D 2200/0086; H03D 7/1441; H03D 7/1466; H03D 7/1458; H04B 1/30;
(Continued)

(56) References Cited

U.S. PATENT DOCUMENTS 6,029,052 A    2/2000  Isberg et al.
6,870,571 B1   3/2005  Narushima et al.
(Continued)

FOREIGN PATENT DOCUMENTS

EP    1 630 950 A1    3/2006
EP    2 360 835 A1    8/2011
(Continued)

OTHER PUBLICATIONS

Non-Final Rejection dated 05/05/52015 in connection with U.S. Appl. No. 14/376,085, 17 pages.*

(Continued)

*Primary Examiner* — Sam K Ahn
*Assistant Examiner* — Amneet Singh
(74) *Attorney, Agent, or Firm* — Leffler Intellectual Property Law, PLLC (57) ABSTRACT A down-conversion circuit for a receiver circuit is disclosed, the down-conversion circuit comprises a first passive switching mixer arranged to down-convert a received radio frequency, RF, signal with a first local oscillator, LO, signal (LO1) having a first duty cycle for generating a first down-converted signal at an output port of the first passive switching mixer. The down-conversion circuit further comprises a second passive switching mixer arranged to down-convert the received RF signal with a second LO signal (LO2) having the same LO frequency as the first LO signal (LO1) and a second duty cycle, different from the first duty cycle, for generating a second down-converted signal at an output port of the second passive switching mixer. In addi- (Continued)

tion, the down-conversion circuit comprises a passive output combiner network operatively connected to the output ports of the first passive switching mixer and the second passive switching mixer and arranged to combine the first and the second down-converted signals such that harmonically down-converted signal content present in the first down-converted signal and harmonically down-converted signal content present in the second down-converted signal cancel in a combined output signal of the down-conversion circuit. The passive output combiner network is tunable to adjust magnitudes and phases of the first and the second down-converted signals. A related quadrature down-conversion circuit, a related receiver circuit, a related communication device, and a related calibration method are also disclosed.

15 Claims, 6 Drawing Sheets

Related U.S. Application Data (60) Provisional application No. 61/596,301, filed on Feb. 8, 2012.

(51) Int. Cl.
| | |
|---|---|
| *H03K 5/01* | (2006.01) |
| *H03K 6/04* | (2006.01) |
| *H04B 1/10* | (2006.01) |
| *H04L 1/00* | (2006.01) |
| *H04L 25/08* | (2006.01) |
| *H04B 1/28* | (2006.01) |
| *H03D 7/14* | (2006.01) |

(52) U.S. Cl.
CPC .............. *H03D 7/1466* (2013.01); *H04B 1/28* (2013.01); *H03D 2200/0088* (2013.01)

(58) Field of Classification Search
CPC ........ H04B 1/28; H04B 1/109; H04B 15/005; H04B 1/1027
See application file for complete search history.

(56) References Cited

U.S. PATENT DOCUMENTS

| | | | |
|---|---|---|---|
| 7,027,793 | B2 | 4/2006 | Gard et al. |
| 7,483,683 | B1 | 1/2009 | Wong et al. |
| 8,525,573 | B2 | 9/2013 | Cicalini |
| 2004/0116096 | A1* | 6/2004 | Shen .................. H04B 1/28 455/323 |
| 2004/0142673 | A1 | 7/2004 | Asayama et al. |
| 2005/0239430 | A1 | 10/2005 | Shah |
| 2007/0268961 | A1 | 11/2007 | Lin |
| 2008/0076375 | A1 | 3/2008 | Cooley et al. |
| 2010/0120377 | A1 | 5/2010 | He |
| 2010/0253412 | A1 | 10/2010 | Brekelmans et al. |
| 2010/0267354 | A1 | 10/2010 | Mirzaei et al. |
| 2010/0283526 | A1 | 11/2010 | Van Sinderen et al. |
| 2010/0317308 | A1 | 12/2010 | Mirzaei et al. |
| 2010/0321590 | A1 | 12/2010 | Satoda et al. |
| 2011/0006849 | A1 | 1/2011 | Lee et al. |
| 2011/0092180 | A1* | 4/2011 | Chen .................. H04B 1/28 455/341 |
| 2011/0217945 | A1 | 9/2011 | Uehara et al. |
| 2011/0300885 | A1 | 12/2011 | Darabi et al. |
| 2013/0293303 | A1 | 11/2013 | Uehara et al. |

FOREIGN PATENT DOCUMENTS

| | | |
|---|---|---|
| RU | 2202854 C2 | 4/2003 |
| RU | 2336626 C2 | 10/2008 |
| RU | 2376704 C2 | 12/2009 |
| WO | 0145279 A1 | 6/2001 |
| WO | 02056489 A2 | 7/2002 |
| WO | 2005/091493 A1 | 9/2005 |
| WO | 2008/139390 A1 | 11/2008 |
| WO | 2010/107460 A1 | 9/2010 |
| WO | 20110101305 A1 | 8/2011 |

OTHER PUBLICATIONS

Final Rejection dated Oct. 22, 2015 in connection with U.S. Appl. No. 14/376,085, 19 pages.*
Notice of Allowance dated Feb. 1, 2016 in connection with U.S. Appl. No. 14/376,085, 9 pages.*
Morishita et al., "Nonlinear analysis of MOS FET passive mixers as a function of local signal," 2012 Asia Pacific Microwave Conference Proceedings, Kaohsiung, 2012, pp. 1217-1219).*
Niknejad, A. M., "Lecture 20: Passive Mixers", University of California, Berkeley, copyright 2005).*
H. Kobayashi, J. Kang, T. Kitahara, S. Takigami and H. Sadamura, "Explicit transfer function of RC polyphase filter for wireless transceiver analog front-end," Proceedings. IEEE Asia-Pacific Conference on ASIC 2002, pp. 137-140.*
PCT International Search Report, dated Apr. 25, 2013, in connection with International Application No. PCT/EP2013/051248, all pages.
Extended European Search Report, dated Jul. 16, 2012, in connection with European Patent Application No. 12153826.8-1246, all pages.
Article EP 94(3) Communication, dated Mar. 3, 2014, in connection with European Patent Application No. 12153826.8-1855, all pages.
Moseley, N. A. et al. "A Two-Stage Approach to Harmonic Rejection Mixing Using Blind Interference Cancellation" IEEE Transactions on Circuits and Systems II: Express Briefs, IEEE, US, vol. 55, No. 10, Oct. 1, 2008, pp. 966-970, XP011236580, ISSN: 1549-7747.
Blaakmeer, S.C. et al. "Wideband balun-Lna with simultaneous output balancing, noise canceling and distortion canceling" IEEE Journal of Solid-State Circuits, vol. 43, No. 6, Jun. 2008, pp. 1341-1350.
EP 94(3) Communication, dated Nov. 13, 2014, in connection with counterpart European Patent Application No. 12 153 826.8-1855, all pages.
PCT International Search Report, dated Apr. 22, 2013, in connection with International Application No. PCT/EP2013/051254, all pages.
Bagheri, Rahim et al. "An 800-MHz-6-GHz Software-Defined Wireless Receiver in 90-nm CMOS" IEEE Journal of Solid-State Circuits, vol. 41, No. 12, Dec. 2006, pp. 2860-2876.
Ru, Z. et al. "A Software-Defined Radio Receiver Architecture Robust to Out-of-Band Interference", 2009 IEEE International Solid-State Circuits Conference, Session 12, RF Building Blocks/12.8, pp. 229-231; 978-1-4244-3457-2/09.
Moseley, Niels et al. "A 400-to-900 MHz Receiver with Dual-domain Harmonic Rejection Exploiting Adaptive Interference Cancellation", 2009 IEEE International Solid-State Circuits Conference, Session 12, RF Building Blocks/12.9, pp. 231-233; 978-1-4244-3457-2/09.
Extended European Search Report, dated Jul. 16, 2012, in connection with European Patent Application No. 12 15 3827, all pages.
Bruccoleri, Federico et al., "Wide-Band CMOS Low-Noise Amplifier Exploiting Thermal Noise Canceling", IEEE Journal of Solid-State Circuits, vol. 39, No. 2, Feb. 2004, 8 pages.
Notice of Allowance dated Sep. 1, 2015 in connection with U.S. Appl. No. 14/375,788, 9 pages.
Decision on Grant dated Aug. 16, 2016 in connection with Russian Application No. 2014135797/08(058010), 11 pages.
English translation of Decision on Grant dated Aug. 16, 2016 in connection with Russian Application No. 2014135797/08(058010), 9 pages.
Lawrence Der et al., A 2-GHz CMOS Image-Reject Receiver With LMS Calibration, IEEE Journal of Solid-State Circuits, vol. 38, No. 2, Feb. 2003, pp. 167-175.

* cited by examiner

DOWN-CONVERSION CIRCUIT

CROSS-REFERENCE TO RELATED APPLICATIONS

This application claims the benefit of U.S. application Ser. No. 14/376,085, filed Jul. 31, 2014 (371(c) date), which is a 35 U.S.C. § 371 national stage of international application PCT/EP2013/051248 filed Jan. 23, 2013, which claims the benefit of U.S. Provisional Application No. 61/596,301, filed Feb. 8, 2012, which applications are hereby incorporated herein by reference in their entireties. This application also claims priority under 35 U.S.C. § 119 to European Patent Application No. 12153826.8, filed Feb. 3, 2012, which is hereby incorporated herein by reference in its entirety.

TECHNICAL FIELD

The present invention relates to a down-conversion circuit for a radio receiver circuit.

BACKGROUND

Due to the deployment of more and more frequency bands for cellular radio-communications applications, the complexity of radio front-end circuitry to be used in such applications increases. Normally, at least one relatively expensive external (or "off-chip") filter, usually a SAW (Surface Acoustic Wave) filter and/or duplexer, has to be used for each frequency band to be received with the cellular radio. Therefore the size and cost of the external front-end components increase when introducing new frequency bands. Striving towards more flexible front-end solutions requires new circuit solutions that can handle strong interferers and prevent harmonic down-conversion without sacrificing any other performance.

It is thus desirable to provide radio front-end circuitry that eliminates the need for at least some of the off-chip filters, e.g. relatively expensive SAW filters and/or duplexers, that are normally used in present radio communications circuitry, or that at least relaxes the requirements on such off-chip filters, which in turn facilitates a reduction of manufacturing cost.

To handle the strong out-of-band interference in cell phones, or other similar communication devices, without using sharp radio frequency (RF) filters, such as SAW filters and/or duplexers, a relatively high linearity is normally needed. Otherwise the unfiltered amplified interference might saturate low-noise amplifiers (LNAs) or down-conversion mixers. To reduce the interference, it has been proposed (e.g. in US 2005/0239430 A1) to use so called harmonic rejection in down-conversion circuitry to suppress interference at harmonics of a local oscillator (LO) signal, which is particularly useful in a radio receiver without sharp RF filters, since interferers at harmonics of the LO signal will be down-converted to baseband and, unless suppressed in some way, detrimentally interfere with the (desired) baseband signal.

WO 2008/139390 A1 discloses a mixer circuit, wherein an input signal is switched in accordance with a first local oscillator signal and in accordance with at least one second local oscillator signal having a smaller duty cycle than said first local oscillator signal, or having a respective predetermined phase shift with respect to said first local oscillator signal. Output signals obtained by the switching in accordance with the first and at least one second local oscillator signals are summed and the polarity of one of said first local oscillator signal and said at least one second local oscillator signal is switched in response to a control input, to thereby switch between a harmonic-rejection mode and a sub-harmonic mixing mode.

SUMMARY

The inventors have realized that many existing solutions (e.g. US 2005/0239430 A1) that attempt to reduce harmonic down conversion mainly do so by relying on active buffers in the mixer and are not very energy efficient. Furthermore, the inventors have realized that many existing solutions (again e.g. US 2005/0239430 A1) that attempt to reduce harmonic down conversion may fail to properly do so, since they do not properly take into account the phase of internally generated compensation signals. An object of embodiments of the present invention is to alleviate one or more of these drawbacks.

According to a first aspect, there is provided a down-conversion circuit for a receiver circuit, such as a radio receiver circuit or a wireline receiver circuit. The down-conversion circuit comprises a first passive switching mixer arranged to down-convert a received radio frequency (RF) signal with a first local oscillator (LO) signal having a first duty cycle for generating a first down-converted signal at an output port of the first passive switching mixer. The down-conversion circuit further comprises a second passive switching mixer arranged to down-convert the received RF signal with a second LO signal having the same LO frequency as the first LO signal and a second duty cycle, different from the first duty cycle, for generating a second down-converted signal at an output port of the second passive switching mixer. Moreover, the down-conversion circuit comprises a passive output combiner network operatively connected to the output ports of the first passive switching mixer and the second passive switching mixer and arranged to combine the first and the second down-converted signals such that harmonically down-converted signal content present in the first down-converted signal and harmonically down-converted signal content present in the second down-converted signal cancel in a combined output signal of the down-conversion circuit. The passive output combiner network may be tunable to adjust magnitudes and phases of the first and the second down-converted signals.

The first duty cycle may e.g. be 25% and the second duty cycle may e.g. be 50%.

Said harmonically down-converted signal content present in the first down-converted signal and said harmonically down-converted signal content present in the second down-converted signal that cancel in the combined output signal may comprise signal content down-converted by 3rd and 5th harmonics of the first LO signal and signal content down converted by 3rd and 5th harmonics of the second LO signal, respectively.

The first and the second down-converted signals may be differential signals and the output port of the first passive switching mixer and the output port of the second passive switching mixer may be differential output ports, each having a first and a second output terminal.

The passive output combiner network may comprise a first resistor operatively connected between the first output terminal of the output port of the first passive switching mixer and a first summing node of the down-conversion circuit. Furthermore, the passive output combiner network may comprise a second resistor operatively connected between the first output terminal of the output port of the second passive switching mixer and the first summing node of the down-conversion circuit. Moreover, the passive output combiner network may comprise a third resistor operatively connected between the second output terminal of the output port of the first passive switching mixer and a second summing node of the down-conversion circuit. The passive output combiner network may further comprise a fourth resistor operatively connected between the second output terminal of the output port of the second passive switching mixer and the second summing node of the down-conversion circuit.

Furthermore, the passive output combiner network may comprise capacitors connected to the first and second output terminals of the output ports of the first and the second passive switching mixers.

The first, second, third, and fourth resistors and the capacitors connected to the first and second output terminals of the output ports of the first and the second passive switching mixers may be tunable to adjust magnitudes and phases of the first and the second down-converted signals.

The down-conversion circuit may be arranged to perform frequency-translated filtering.

The second passive switching mixer may have an enabled and a disabled mode, and the down-conversion circuit may be arranged to selectively set the second passive switching mixer in the enabled mode when an interference level exceeds a threshold for counteracting the interference, and, otherwise, in the disabled mode for saving power compared with the enabled mode.

The down-conversion circuit may have a detection mode, in which the passive output combiner network is configured to combine the first and the second down-converted signals such that harmonically down-converted signal content present in the first down-converted signal and harmonically down-converted signal content present in the second down-converted signal combine constructively in the combined output signal of the down-conversion circuit, whereas signal content present in the first down-converted signal and the second down-converted signal, down-converted by the fundamental of the first and the second LO signal, respectively, cancel in the combined output signal of the down-conversion circuit for detecting when said interference level exceeds said threshold.

The down-conversion circuit may comprise a first low-noise amplifier (LNA) arranged to supply the received RF signal to an input port of the first passive switching mixer and a separate second LNA arranged to supply the received RF signal to an input port of the second passive switching mixer. The first LNA may e.g. have a common gate topology and the second LNA may e.g. have a common source topology. The first and second LNA may be tunable to adjust magnitudes and phases of the first and the second down-converted signals.

According to a second aspect, there is provided a quadrature down-conversion circuit for a receiver circuit, such as a radio receiver circuit or a wireline receiver circuit. The quadrature down-conversion circuit comprises a first and a second down-conversion circuit according to the first aspect arranged in an in-phase (I) signal path and a quadrature-phase (Q) signal path, respectively, of the quadrature down-conversion circuit.

The first passive switching mixer of the first down-conversion circuit and the first passive switching mixer of the second down-conversion circuit may share a common input port.

According to a third aspect, there is provided receiver circuit, such as a radio receiver circuit or a wireline receiver circuit, comprising the down-conversion circuit according to the first aspect or the quadrature down-conversion circuit according to the second aspect.

According to a fourth aspect, there is provided a communication device comprising the radio receiver circuit according to the third aspect. The communication device may e.g. be, but is not limited to, a wireless communication device such as a mobile phone, a wireless data modem, or a radio base station, or a wireline communication device.

According to a fifth aspect, there is provided a method of tuning the down-conversion circuit according to the first aspect, having a tunable passive output combiner network. The method comprises generating an oscillating test signal having a frequency which is offset by a frequency df from a harmonic of the LO frequency, wherein the frequency df falls within a passband or transition band of a channel-selection filter arranged to filter the combined output signal. Furthermore, the method comprises injecting the oscillating test signal into the input ports of the first and second passive switching mixers. Moreover, the method comprises tuning components of the passive output combiner network by first tuning tunable resistors of the passive output combiner network for determining a resistor tuning setting that minimizes the power contribution of the oscillating test signal at the output of the channel selection filter for a default setting of tunable capacitors of the passive output combiner network, and thereafter, tuning said tunable capacitors of the passive output combiner network for determining a capacitor tuning setting that minimizes the power contribution of the oscillating test signal at the output of the channel selection filter for said determined setting of said tunable resistors of the passive output combiner network. The method further comprises applying said determined resistor tuning setting and said determined capacitor tuning setting to the tunable resistors and the tunable capacitors, respectively.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
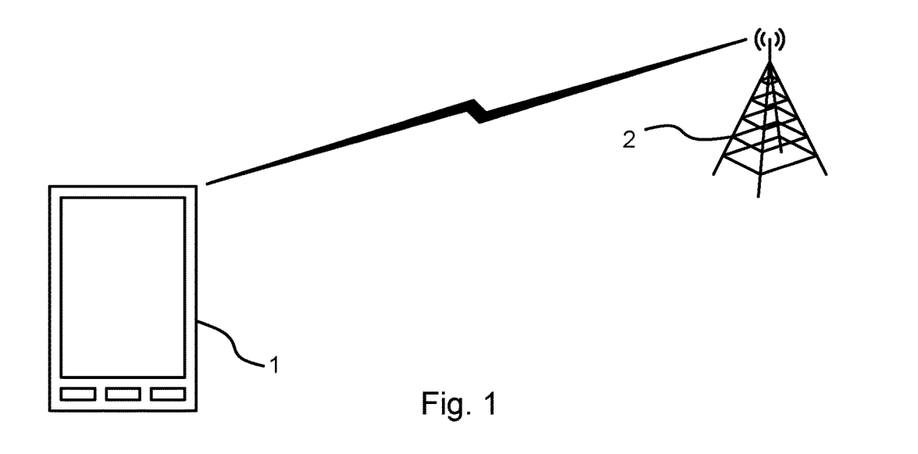
FIG. 1 schematically illustrates a mobile terminal in communication with a radio base station.

FIG. 1 illustrates schematically an environment in which embodiments of the present invention may be employed. In FIG. 1, a mobile terminal 1, illustrated in FIG. 1 as a mobile, or cellular, telephone 1, is in wireless communication with a radio base station 2, e.g. in a cellular communication network. The mobile telephone 1 and the radio base station 2 are nonlimiting examples of what is referred to below generically with the term communication device. Another nonlimiting example of such a communication device is a wireless data modem, e.g. a wireless data modem to be used in a cellular communication network. Embodiments of the present invention may also be employed in communication devices for operation in other types of communication networks, such as but not limited to wireless local area networks (WLANs) and personal area networks (PANs). The examples considered above are all wireless communication devices, but embodiments of the present invention may be employed in wireline communication devices as wells.

Figure 2:
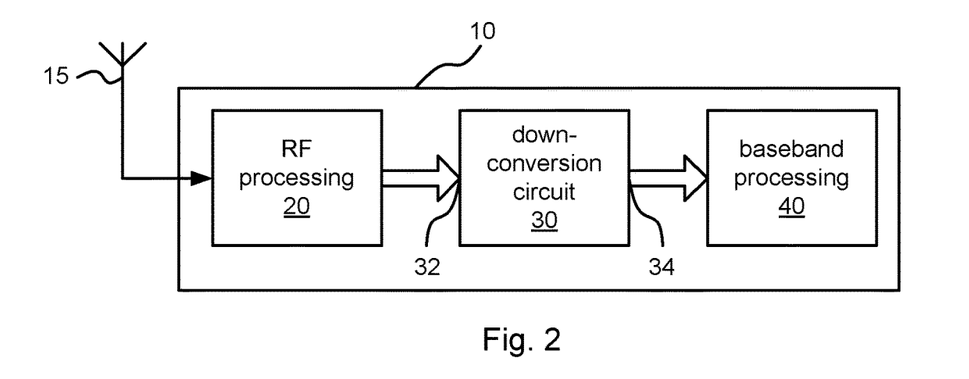
FIGS. 2-3 show simplified block diagrams of a radio receiver circuit according to some embodiments of the present invention.

Such communication devices may comprise one or more receiver circuits. In the following, such receiver circuits are referred to in a wireless communication context as radio receiver circuits. However, as mentioned above, embodiments of the present invention are applicable in wireline communication devices as well. An example of such a radio receiver circuit is briefly described below with reference to FIG. 2. FIG. 2 is a simplified block diagram of a radio receiver circuit 10 according to an embodiment of the present invention. In FIG. 2, the radio receiver circuit 10 is connected to an antenna 15 for receiving electromagnetic radio frequency (RF) signals. Although a single antenna 15 is shown in FIG. 2, multiple antennas may well be used in other embodiments. In the embodiment illustrated in FIG. 2, the radio receiver circuit comprises RF processing circuitry 20 for operative connection to the antenna 15. The RF processing circuitry 20 is adapted to perform (analog) signal processing on RF signals from the antenna 15. The RF processing circuitry may comprise one or more filters, transformers (e.g. balun transformers), and/or other circuitry for processing of RF signals. Such circuitry is, per se, well known in the art of radio receivers and is therefore not further described herein in greater detail. (In a wireline communication device, the antenna 15 is replaced with a cable connector.)

Furthermore, the embodiment of the radio receiver circuit 10 illustrated in FIG. 2 comprises a down-conversion circuit 30 for down-conversion, frequency translation to a lower frequency, of a received RF input signal (in this particular context first processed by the RF processing circuitry 20). Such frequency translation is based on a local oscillator (LO) signal, and may be referred to as "down-converting the received RF signal with the LO signal". The down-conversion circuit 30 has an input port 32 for supplying the received RF signal to the down-conversion circuit. Furthermore, the down-conversion circuit 30 has an output port 34 for outputting a down-converted output signal.

Figure 3:
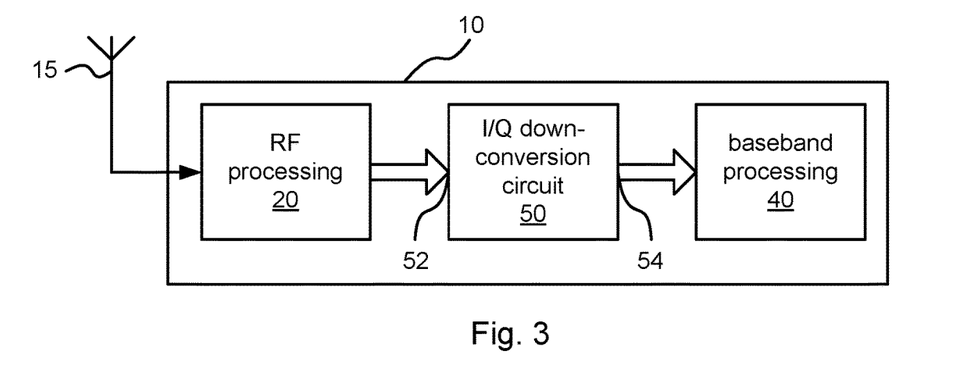

FIG. 3 shows another simplified block diagram of the radio-receiver circuit 10 according to some embodiments of the present invention, similar to the embodiments illustrated in FIG. 2. However, in FIG. 3, the down-conversion circuit 30 (FIG. 2) is replaced with a quadrature (or "I/Q") down-conversion circuit, having an in-phase (I) and a quadrature-phase (Q) signal path.

The radio receiver circuit 10 illustrated with embodiments in FIGS. 2-3 is assumed to be a homodyne radio receiver circuit. Thus, the radio receiver circuit 2 comprises baseband processing circuitry 40 operatively connected to the output port 34 of the down-conversion circuit 30 for processing the output signal from the down-conversion circuit 30. However, embodiments of the down-conversion circuit 30 described herein are applicable in other types of radio receiver circuits as well, e.g. radio receiver circuits wherein frequency translation is performed in one or more steps to one or more (non-zero) intermediate frequencies (IFs).

The baseband processing circuitry 40 may comprise one or more filters, amplifiers, analog-to-digital converters, digital signal processors, and/or other circuitry for processing of baseband signals. Such circuitry is, per se well known in the art of radio receivers and is therefore not further described herein in greater detail.

Figure 4:
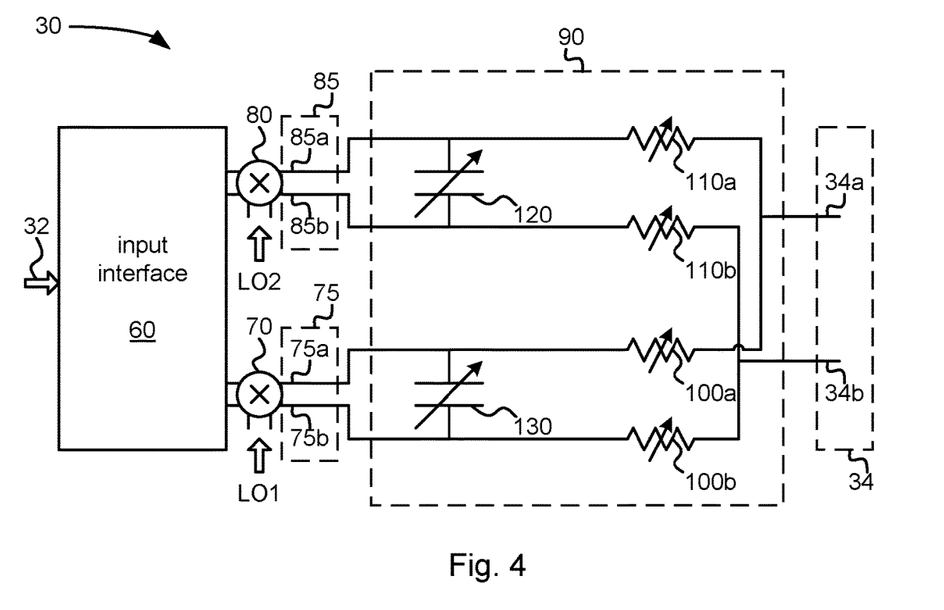
FIG. 4 is a schematic circuit diagram of a down-conversion circuit according to some embodiments of the present invention.

FIG. 4 shows a simplified schematic circuit diagram of the down-conversion circuit 30 according to some embodiments of the present invention. FIG. 4 illustrates a differential down-conversion circuit 30 using differential LO signals and differential signal paths. The embodiments described in detail herein are such differential embodiments. However, single-ended implementations are also possible according to some embodiments of the present invention. In FIG. 4, the down-conversion circuit 30 comprises a first passive switching mixer 70. The first passive switching mixer 70 is arranged to down-convert the received RF signal with a first LO signal LO1 for generating a first down-converted signal at an output port 75 of the first passive switching mixer 70. The first LO signal LO1 has a frequency, in the following referred to as the LO frequency. Furthermore, the first LO signal LO1 has a first duty cycle.

Furthermore, in FIG. 4, the down-conversion circuit 30 comprises a second passive switching mixer 80. The second passive switching mixer 80 is arranged to down-convert the received RF signal with a second LO signal LO2 for generating a second down-converted signal at an output port (85) of the second passive switching mixer 80. The second LO signal LO2 has the same LO frequency as the first LO signal LO1. Furthermore, the second LO signal LO2 has a second duty cycle, different from the first duty cycle.

As illustrated in FIG. 4, the down-conversion circuit 30 may comprise an interface circuit 60 arranged to distribute the received RF signal to the first and the second passive switching mixers 70 and 80. Such an input interface circuit 60 may e.g. comprise one or more low-noise amplifiers (LNAs), e.g. as described below with reference to FIG. 7.

Moreover, In FIG. 4, the down-conversion circuit 30 comprises a passive output combiner network 90 operatively connected to the output ports 75, 85 of the first passive switching mixer 70 and the second passive switching mixer 80. The passive output combiner network 90 is arranged to combine the first and the second down-converted signals such that harmonically down-converted signal content present in the first down-converted signal and harmonically down-converted signal content present in the second down-converted signal cancel in a combined output signal of the down-conversion circuit 30. The combined output signal is output on the output port 34 of the down-conversion circuit.

In FIG. 4, a particular implementation of the passive output combiner network 90 comprising resistors 100a-b, 110a-b and capacitors 120, 130 is shown. Before going into such details of a particular implementation, some more general principles of the harmonic rejection provided by embodiments of the down-conversion circuit 30 are first described.

Figure 5:
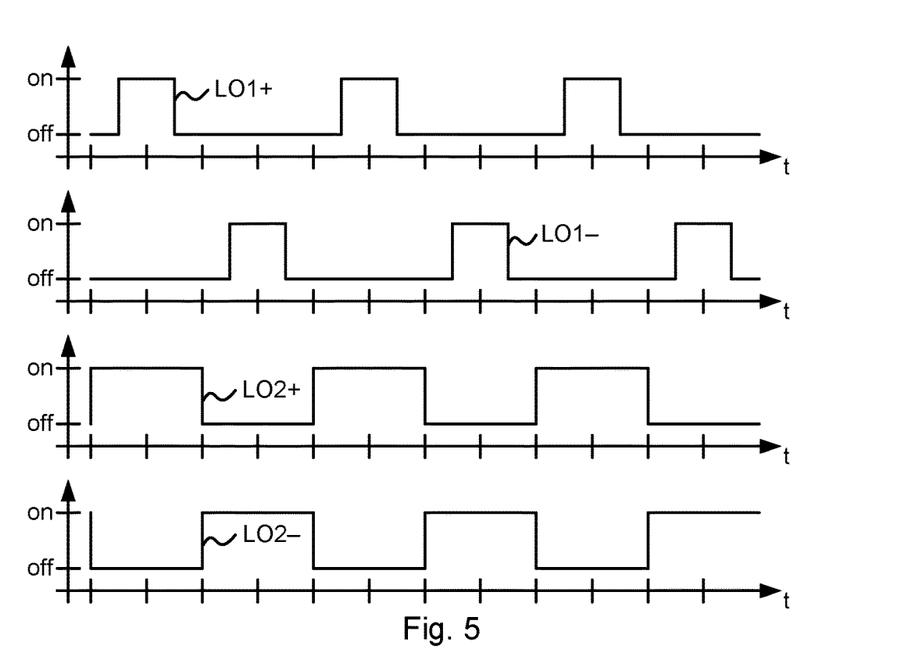
FIG. 5 illustrates local oscillator (LO) signal waveforms according to an example.

According some embodiments of the present invention, which are used throughout this detailed description as an elucidating example, the first duty cycle is 25% and the second duty cycle is 50%. This is illustrated in FIG. 5, which schematically illustrates waveform diagrams of the LO signals LO1 and LO2 with these duty cycles. Since differential LO signals are considered, LO1 has a positive signal component LO1+ and a negative signal component LO1−. Similarly, LO2 has a positive signal component LO2+ and a negative signal component LO2−. Since switching mixers (70 and 80 in FIG. 4) are used, the LO signal waveforms are square waves. Therefore, the mixers 70 and 80 will not only down-convert signal content with the fundamental tones of the respective LO signals LO1 and LO2, but also with harmonics of the LO signals LO1 and LO2, referred to above and in the following as harmonically down-converted signal content. Unless compensated for, such harmonically down-converted signal content will interfere with the desired signal content (i.e. the signal content down-converted with the fundamental tone of an LO signal). Using a differential topology (e.g. as in FIG. 4) inherently suppresses signal content down-converted by even-order harmonics. However, it does not take care of signal content down-converted by odd-order harmonics. Using a Fourier-series expansion of square-wave signals with amplitude A, angular frequency ω, and a duty-cycle of k/T, it can be shown that the 3rd harmonic is given by $$\frac{2A}{\pi}\frac{1}{3}\sin\left(3\pi\frac{k}{T}\right)\cos(3\omega t) \quad \text{(Eq. 1)}$$

where t denotes time. Similarly, the 5th harmonic is given by $$\frac{2A}{\pi}\frac{1}{5}\sin\left(5\pi\frac{k}{T}\right)\cos(5\omega t) \quad \text{(Eq. 2)}$$

Inserting 0.25 for k/T in Eq. 1 and Eq. 2 provides the 3rd and 5th harmonics, respectively, for the 25% duty-cycle square wave, in the following denoted $h_{25}^3(t)$ and $h_{25}^5(t)$, respectively. Similarly, inserting 0.5 for k/T in Eq. 1 and Eq. 2 provides the 3rd and 5th harmonics, respectively, for the 50% duty-cycle square wave, in the following denoted $h_{50}^3(t)$ and $h_{50}^5(t)$, respectively. It can be shown that $$h_{25}^3(t) = -\sqrt{2}h_{50}^3(t) \quad \text{(Eq. 3)}$$

and $$h_{25}^3(t) = -\sqrt{2}h_{50}^5(t) \quad \text{(Eq. 4)}$$

Hence, there is the same weight-deviation between the 3rd harmonics of the 50% and 25% duty-cycle square-wave signals as there is between the 5th harmonics of the 50% and 25% duty-cycle square-wave signals. Thus, by properly weighting the output currents from the mixers 70 and 80, harmonically down-converted signal content down-converted by both the 3rd and the 5th harmonics of the first and second LO signals LO1 and LO2 will cancel in the combined output signal. At the same time, it can be noted that signal content down-converted by the fundamental tones of the first and second LO signals LO1 and LO2 will under these circumstances combine constructively.

Accordingly, in accordance with some embodiments of the present invention, said harmonically down-converted signal content present in the first down-converted signal and said harmonically down-converted signal content present in the second down-converted signal that cancel in the combined output signal comprises signal content down-converted by 3rd and 5th harmonics of the first LO signal LO1 and signal content down converted by 3rd and 5th harmonics of the second LO signal LO2, respectively.

It should be noted that, in practice, it is not possible to generate LO signals with exactly 25% and 50% duty cycle; the duty cycles will deviate from these values e.g. due to manufacturing inaccuracies, temperature variations, noise, etc. Thus, the numbers 25% and 50% should not be interpreted as exactly 25% and 50%. Deviations from these exact numbers (or other intended duty cycles) may be compensated for using tuning of the passive output combiner network.

Selecting other combinations of duty cycles than 25% and 50% may provide for cancellation of other harmonics or combination of harmonics. However, the 3rd and 5th harmonics are normally the most important ones to cancel, since the amplitude of the harmonics decrease with increasing order. In some embodiments, the duty cycle of the second LO signal LO2 may be selected as (approximately) twice the duty cycle of the first LO signal LO1. Such a relation between the duty cycles provides for a relatively easy generation of the LO signals LO1 and LO2.

Figure 6:
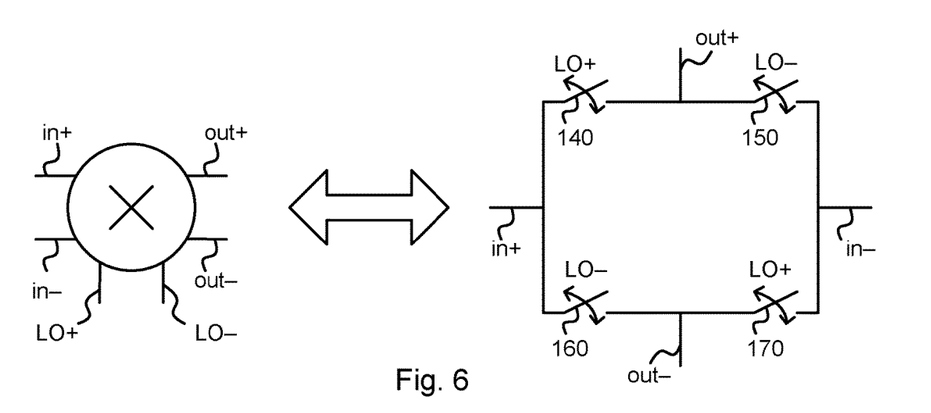
FIG. 6 illustrates implementation of a passive switching mixer.

FIG. 6 illustrates an implementation of a passive switching mixer according to embodiments of the present invention, which may used for implementation of the first and second passive mixers 70 and 80 in the down-conversion circuit 30. In passive switching mixers, a switch is used to either connect an input terminal to an output terminal in a closed state, or disconnect the input terminal from the output terminal in an open state, in response to an LO signal (such as the first LO signal LO1 or the second LO signal LO2). The passive switching mixer in FIG. 6 has a differential input port with input terminals in+ and in−, and a differential output port with output terminals out+ and out−. Furthermore, a differential LO signal having signal components LO+ (e.g. LO1+ or LO2+) and LO− (e.g. LO1− or LO2−) is used to control the switches in the passive switching mixer. Such a passive switching mixer is normally referred to as a double-balanced passive mixer. In FIG. 6, the passive switching mixer comprises a switch 140 connected between in+ and out+, a switch 150 connected between in− and out+, a switch 160 connected between in+ and out−, and a switch 170 connected between in− and out−. The switches 140 and 170 are controlled with LO+, and the switches 150 and 160 are controlled with LO−. Comparing with FIG. 5, the state 'on' means that a corresponding switch is closed, and the state 'off' means that a corresponding switch is open. The switches in a passive switching mixer may be implemented with transistors, such as MOS transistors.

The use of passive switching mixers together with a passive output combiner network provides for a dual functionality for interference suppression. In addition to the harmonic rejection described above, the down-conversion circuit may additionally be arranged to provide frequency-translated filtering. For example, the passive output combiner network may have a low-pass characteristic as seen from the output ports of the passive switching mixers 70 and 80. Seen from the input ports of the passive switching mixers, the low-pass characteristic is transformed to a bandpass characteristic, which provides for a further suppression of interference. Frequency translated filtering is known as such, see e.g. US 2010/0267354. However, frequency-translated filters are normally used as separate components. Using embodiments of the present invention, the frequency translated filtering is built in into the down-conversion circuit 30 that performs the harmonic rejection, which is beneficial for saving power and/or circuit area, since no additional dedicated circuitry is required for the frequency translated-filtering.

According to some embodiments of the present invention, the passive output combiner network 90 is tunable to adjust magnitudes and phases of the first and the second down-converted signals. Using a tunable network of passive component provides for combining the first and second down-converted signals such that the harmonically down-converted signal content cancel with relatively high accuracy in the combined output signal, e.g. compared with known techniques that attempt to reduce harmonic down conversion by relying on active buffers with weighted amplitudes. In particular, even though such known techniques may use control of the amplitude weights of the active buffers, it is difficult (or even neglected) to control the phases of signals to be combined for canceling harmonically down-converted signal content, which may limit the effectiveness of the cancellation. There is a similar problem for the circuit disclosed in WO 2008/139390 A1 (see e.g. FIG. 2 of WO 2008/139390 A1), which relies on matching of component parameter values (with an irrational number ($\sqrt{2}$) as a parameter weight, which is difficult to achieve in practice) and on accuracy of timing and duty cycles of clock signals to accomplish harmonic rejection; mismatch or inaccuracies for any of these factors will limit the achievable suppression. The inventors have realized that such phase control can be made more effectively using a tunable passive combiner network. Furthermore, known techniques relying on active buffers in the signal paths for controlling the cancellation normally requires more than two signal paths whose respective output signals are combined, whereas embodiments of the present invention can provide for relatively accurate cancellation of harmonically down-converted signal content using only two signal paths (although the scope of the invention is not intended to exclude embodiments where additional signal paths with other duty cycle are present as well).

An example of such a tunable passive network used for the passive output combiner network is illustrated in FIG. 4. Since a differential topology is considered, the first and the second down-converted signals are differential signals. Furthermore, the output port 75 of the first passive switching mixer 70 and the output port 85 of the second passive switching mixer 80 are both differential output ports, each having a first and a second output terminal 75a-b, 85a-b.

In FIG. 4, the passive output combiner network 90 comprises a first resistor 100a, a second resistor 110a, a third resistor 100b, and a fourth resistor 110b. The first resistor 100a is operatively connected between the first output terminal 75a of the output port 75 of the first passive switching mixer 70 and a first summing node (in this case, the output terminal 34a of the down-conversion circuit 30). The second resistor 110a is operatively connected between the first output terminal 85a of the output port 85 of the second passive switching mixer 80 and the first summing node 34a. The first and second resistor act as voltage-to-current (V/I) converters and their respective currents are combined (or summed) in the first summing node. The weights of the currents are determined by the resistance values of the first and second resistors 100a and 110a.

Similarly, the third resistor 100b is operatively connected between the second output terminal 75b of the output port 75 of the first passive switching mixer 70 and a second summing node (in this case the output terminal 34b of the down-conversion circuit 30). The fourth resistor 110b is operatively connected between the second output terminal 85b of the output port 85 of the second passive switching mixer 80 and the second summing node. The third and fourth resistor also act as V/I converters and their respective currents are combined (or summed) in the second summing node. The weights of the currents are determined by the resistance values of the third and fourth resistors 100a and 110a.

Furthermore, in FIG. 4, the passive output combiner network 90 comprises capacitors 120 and 130 connected to the first and second output terminals 75a-b, 85a-b of the output ports 75, 85 of the first and the second passive switching mixers 70, 80. In FIG. 4, the capacitor 120 is shown as a differential capacitor connected between the output terminals 85a and 85b of the output port 85 of the second passive switching mixer 80, and the capacitor 130 is shown as a differential capacitor connected between the output terminals 75a and 75b of the output port 75 of the first passive switching mixer 70. However, capacitors may be connected in other ways to the output terminals 75a-b and 85a-b. For example, alternatively or additionally, capacitors may be connected between one or more of the output terminals 75a-b, 85a-b and a reference-voltage node such as ground. The phases of the first and second down-converted signals are affected by the capacitance values of the capacitors (such as 120 and 130 in FIG. 4) connected to the first and second output terminals 75a-b, 85a-b of the output ports 75, 85 of the first and the second passive switching mixers 70, 80. This topology of the passive output combiner network has a low-pass characteristic. Qualitatively speaking, low-frequency currents are directed via the resistors 100a-b, 110a-b to the summing nodes, whereas high-frequency currents are directed via the capacitors. As mentioned above, this low-pass characteristic is transformed to a band-pass characteristic at the input ports of the mixers 70 and 80, thereby providing frequency-translated filtering.

According to some embodiments, the aforementioned resistors (100a-b, 110a-b in FIG. 4) and capacitors (120-130 in FIG. 4) are tunable components, as indicated by arrows over these components in FIG. 4. For example, they may be digitally-controllable components, such that their respective resistance values or capacitance values are controllable with s digital control word. Thereby, the magnitudes and phases of the first and the second down-converted signals can be adjusted, which in turn facilitates a relatively accurate cancellation of harmonically down-converted signal content in the combined output signal. Examples of how the tuning may be performed are described below with reference to FIGS. 10-12.

According to some embodiments, the second passive switching mixer 80 may be disabled when the interference present at harmonics of the LO frequency is low, thereby saving power. For example, the second LO signal LO2 may be set to "zero", i.e. in a state where all switches of the second passive switching mixer are open. Then, there is no charging or discharging of the gates of the transistors in the switches, whereby power is saved. Furthermore, it is possible to disable other circuitry in connection with the second passive mixer, e.g. circuitry in the input interface 60, thereby saving further power.

Accordingly, in some embodiments of the present invention, the second passive switching mixer 80 has an enabled and a disabled mode. The down-conversion circuit 30 may be arranged to selectively set the second passive switching mixer 80 in the enabled mode when an interference level exceeds a threshold for counteracting the interference, and, otherwise, in the disabled mode for saving power compared with the enabled mode.

The presence of interference may e.g. be detected in idle time intervals, i.e. when the radio-receiver circuit is not receiving any data. Then, instead of cancelling the harmonically down-converted signal content, the down-conversion circuit 30 may instead be configured to cancel signal content down-converted by the fundamental tones of the first LO signal LO1 and the second LO signal LO2. Hence, the down-conversion circuit may have a detection mode, in which the passive output combiner network 90 is configured to combine the first and the second down-converted signals such that harmonically down-converted signal content present in the first down-converted signal and harmonically down-converted signal content present in the second down-converted signal combine constructively in the combined output signal of the down-conversion circuit 30, whereas signal content present in the first down-converted signal and the second down-converted signal, down-converted by the fundamental of the first and the second LO signal LO1, LO2, respectively, cancel in the combined output signal of the down-conversion circuit 30 for detecting when said interference level exceeds said threshold. This may e.g. be accomplished by shifting the phase(s) of the first LO signal LO1 and/or the second LO signal LO2, thereby effectively reversing the sign of the combination of the first and the second down-converted signals from an addition to a subtraction.

Figure 7:
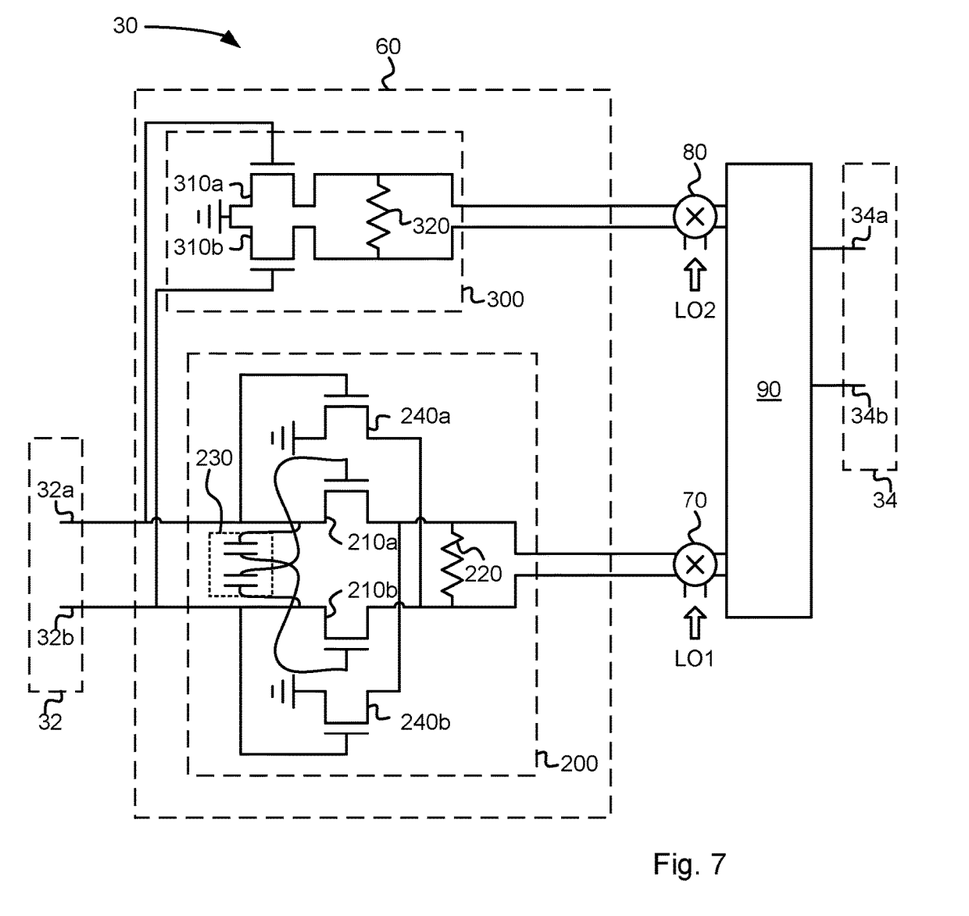
FIG. 7 is a schematic circuit diagram of a down-conversion circuit according to some embodiments of the present invention.

According to some embodiments of the present invention, the down-conversion circuit 30 may comprise separate low-noise amplifiers (LNAs) for supplying the received RF signal to the first and the second passive switching mixers 70, 80, respectively. For example, these LNAs may be located in the input interface 60. An example of this according to some embodiments is shown in FIG. 7, where the input interface 60 is shown to comprise a first LNA 200 arranged to supply the received RF signal to an input port of the first passive switching mixer 70 and a separate second LNA 300 arranged to supply the received RF signal to an input port of the second passive switching mixer 80. The first and the second LNA 200, 300 may be tunable to adjust magnitudes and phases of the first and the second down-converted signals. Thereby, an additional tuning can be provided to further fine-tune the accuracy of the cancellation of harmonically down-converted signal content. The LNAs 200 and 300 may e.g. be tunable by tuning bias currents of the LNAs 200 and 300, whereby transconductances of transistors in the LNAs 200 and 300 can be tuned.

In some embodiments, such as that illustrated in FIG. 4, the first LNA 200 has a common gate topology and the second LNA 300 has a common source topology. One benefit of this combination is that it simplifies the input-impedance matching. The input impedance of the first (common gate) LNA 200 may be matched to a source impedance (such as an output impedance of the RF processing circuitry 20 in FIGS. 2 and 3). Such matching is, per se, well known and not further described herein. Since the second (common source) LNA 300 has (ideally) infinite input impedance, it does not affect the input impedance matching provided by the first LNA 200. Thus, the input impedance matching may be provided by matching of the first LNA 200 only, which simplifies the design. Furthermore, the second LNA 300 can be switched off, or disabled, without affecting the input impedance match. For instance, in embodiments described above where the second passive switching mixer has an enabled and a disabled mode, the second LNA 300 can be disabled simultaneously with the second passive switching mixer 80.

In the example illustrated in FIG. 7, the first LNA 200 comprises input transistors 210a and 210b having their source terminals connected to the input terminals 32a and 32b, respectively. Furthermore, the drain terminals of the input transistors 210a and 210b are each connected to a separate input terminal of the first passive switching mixer 70. A load impedance (shown in FIG. 7 as a resistor) 220 is provided between the drain terminals of the input transistors 210a and 210b. As indicated in FIG. 7, the gate terminals of the input transistors 210a and 210b may be connected via a capacitive cross coupling 230 to the input terminals 32b and 32a, respectively. In some embodiments, the gate terminals of the input transistors 210a and 210b may instead be biased with a bias voltage. A first additional transistor 240a is connected with its source terminal to ground, its gate terminal to the input terminal 32a, and its drain terminal to the drain terminal of the input transistor 210b. A second additional transistor 240b is connected with its source terminal to ground, its gate terminal to the input terminal 32b, and its drain terminal to the drain terminal of the input transistor 210a. The first and second additional transistors 240a and 240b may be used for canceling transistor noise of the input transistors 210a and 210b in the first LNA circuit 200, e.g. according to the principles disclosed in S. C. Blaakmeer et al, "Wideband balun-LNA with simultaneous output balancing, noise canceling and distortion canceling", *IEEE Journal of Solid-State Circuits*, vol. 43, no. 6, June 2008, pp. 1341-1350.

Furthermore, in the example illustrated in FIG. 7, the second LNA 300 comprises input transistors 310a and 310b having their source terminals grounded and their gate terminals connected to the input terminals 32a and 32b, respectively. Furthermore, the drain terminals of the input transistors 310a and 310b are each connected to a separate input terminal of the second passive switching mixer 80. A load impedance (shown in FIG. 7 as a resistor) 320 is provided between the drain terminals of the input transistors 310a and 310b.

Individually, and per se, the topologies of the first LNA 200 and the second LNA 300 shown with circuit schematics in FIG. 4 and described in the two preceding paragraphs are known, and are therefore not described in any further detail herein.

Figure 8:
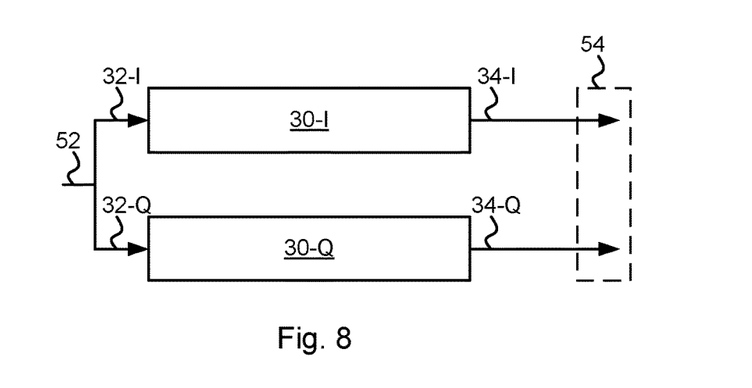
FIG. 8 is a simplified block diagram of a quadrature down-conversion circuit according to some embodiments of the present invention.

FIG. 8 is a simplified block diagram of the quadrature down-conversion circuit 50 (FIG. 3) according to some embodiments of the present invention. In FIG. 8, the quadrature down-conversion circuit 50 comprises a first down-conversion circuit 30-I arranged in an in-phase (I) signal path of the quadrature down-conversion circuit 50. Furthermore, in FIG. 8, the quadrature down-conversion circuit 50 comprises a second down-conversion circuit 30-Q arranged in a quadrature-phase (Q) signal path of the quadrature down-conversion circuit 50. Both down-conversion circuits 30-I and 30-Q are of the same type as the down-conversion circuit 30 described above with reference to certain embodiments. The first and second LO signals of the first down-conversion circuit 30-I are in the following denoted LO1-I and LO2-I, respectively. Similarly, the first and second LO signals of the second down-conversion circuit 30-Q are in the following denoted LO1-Q and LO2-Q, respectively. The LO signals LO1-Q and LO2-Q have the same LO frequency as the LO signals LO1-I and LO2-I, but are 90 degrees out of phase with the LO signals LO1-I and LO2-I, respectively. Thereby, quadrature down-conversion is accomplished. The general concept of quadrature down-conversion is, per se, well known and is not described herein in any further detail.

Figure 9:
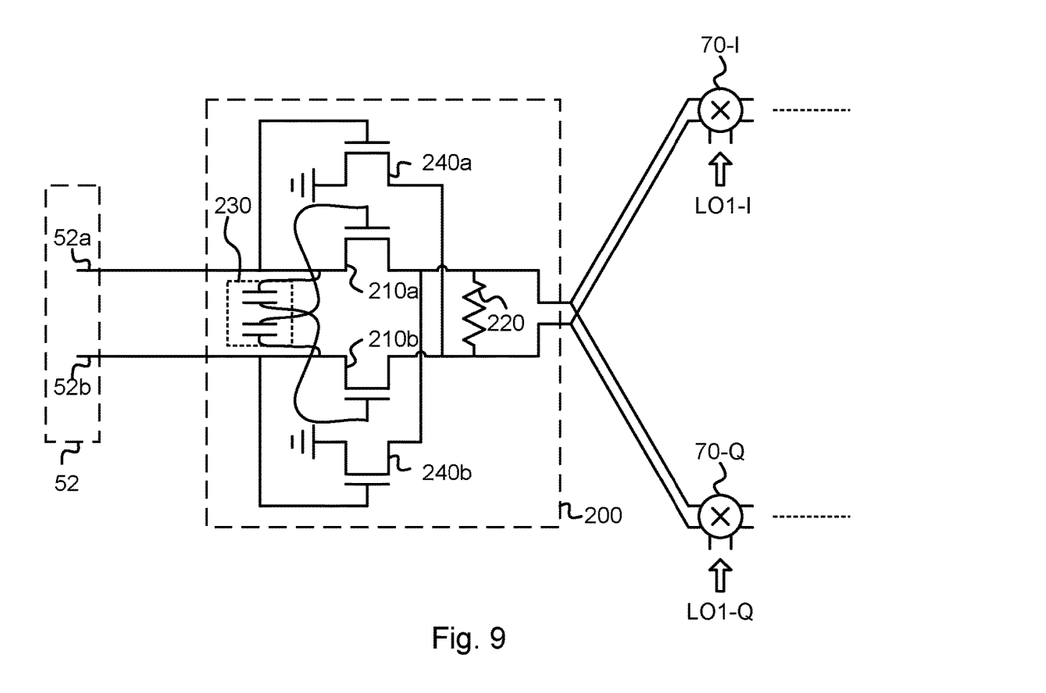
FIG. 9 is a schematic circuit diagram of part of a quadrature down-conversion circuit according to some embodiments of the present invention.

According to some embodiments, the first passive switching mixer (in the following denoted 70-I) of the first down-conversion circuit 30-I and the first passive switching mixer (in the following denoted 70-Q) of the second down-conversion circuit 30-Q may share a common input port. This is possible without risking unwanted internal short circuits via the switches in the passive switching mixers 70-I and 70-Q, provided that a 25% (or lower) duty cycle is used for the LO signals LO1-I and LO1-Q. As a consequence, the mixers 70-I and 70-Q may also share a common LNA, whereby circuit area can be saved. This is illustrated in FIG. 9, wherein the LNA 200 is connected to both of the mixers 70-I and 70-Q.

Figure 10:
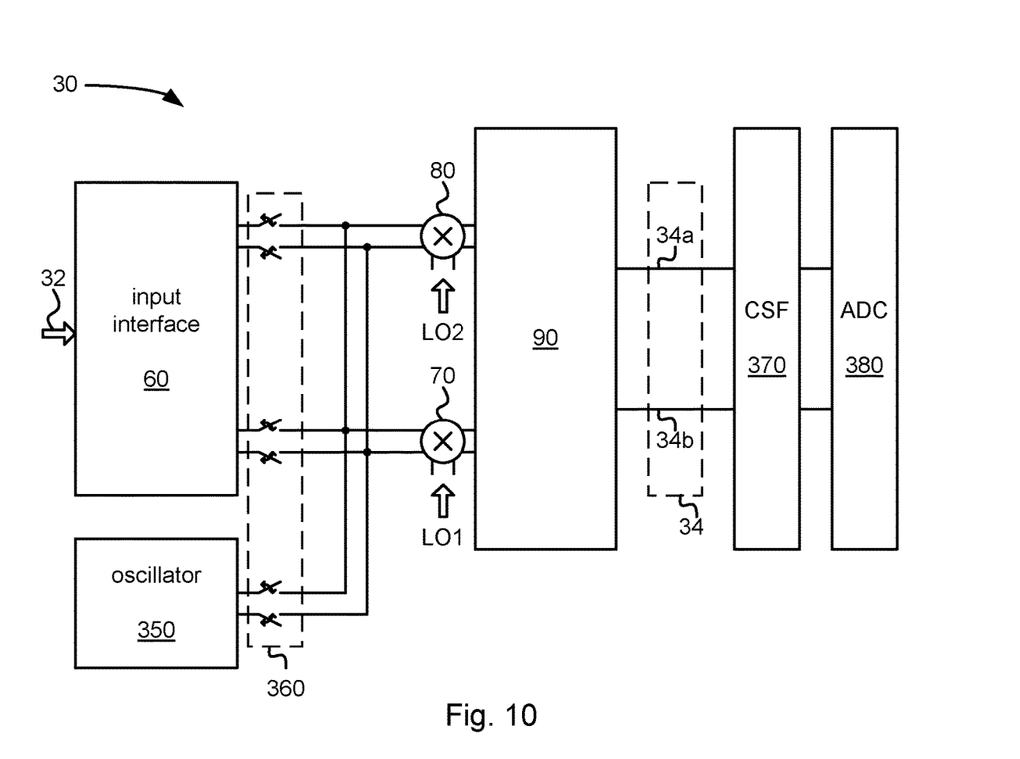
FIG. 10 is a simplified block diagram of a down-conversion circuit according to some embodiments of the present invention, including some circuitry for calibrating the same.

FIG. 10 is a simplified block diagram of the down-conversion circuit 30 according to some embodiments of the present invention, including some circuitry for calibrating, or tuning, the down-conversion circuit 30. In addition to the circuitry already described above, FIG. 10 shows an oscillator 350, switches 360, a channel-selection filter (CSF) 370, and an analog-to digital converter (ADC) 380.

The CSF 370 is arranged to filter the combined output signal of the down-conversion circuit, thereby generating a channel-filtered signal. The ADC 380 is adapted to convert the channel-filtered signal into a digital representation, thereby generating a digital signal, which may be subject to further digital signal processing (e.g. demodulation, decoding, etc.)

The oscillator 350 is operatively connectable to the input ports of the first and the second mixer 70 and 80 (through switches among the switches 360). The oscillator 350 is adapted to generate an oscillating test signal (e.g. a sinusoidal or approximately sinusoidal test signal) having a frequency which is offset by a frequency df from a harmonic of the LO frequency. Said harmonic of the LO frequency is a harmonic for which harmonically down-converted signal content is to be canceled in the combined output signal. For instance, in the examples considered in this specification, said harmonic is the 3rd or the 5th harmonic. In the following description, it is assumed as an example that the oscillating test signal is offset with the frequency df from the third harmonic of the LO frequency. That is, the frequency of the oscillating test signal is $f_{test}=3f_{LO}+df$, where $f_{LO}$ is the LO frequency. If the oscillating test signal is injected into the input ports of the first and second passive switching mixers 70 and 80, it will be down-converted by the third harmonic of the first and second LO signal LO1 and LO2, respectively, to the frequency df in the first and second down-converted signals. It should be noted that the oscillator 350 need not be a very accurate oscillator, but can be a relatively simple (low-cost) oscillator that e.g. has a relatively high phase noise, etc.

Figure 11:
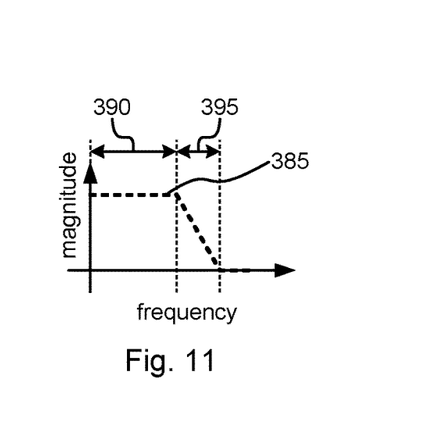
FIG. 11 schematically illustrates a magnitude response of a channel-selection filter according to an example.

FIG. 11 schematically illustrates a magnitude response 385 of the CSF 370 according to an example. Indicated in FIG. 11 are a passband 390 and a transition band 395 of the CSF 370. To avoid detrimental aliasing of unsuppressed interference into the signal band, the sampling frequency of the ADC 380 would normally be set to at least two times the upper transition band limit. Thus, assuming that the down-conversion circuit 30 is not correctly tuned, such that the harmonically down-converted signal content do not correctly cancel, then a harmonically down-converted version of the oscillating test signal will appear in the digital signal, and be distinguishable from signals at other frequencies, provided that the frequency df is selected to fall within the passband 390 or the transition band 395, and can thus be used for measuring the current status of the tuning. An advantage of selecting df to fall within the passband 390 is that the harmonically down-converted version of the oscillating test signal is not (or only slightly) suppressed by the CSF 370. However, this may require that the calibration, or tuning, be performed during idle time intervals, i.e. when the radio-receiver circuit 10 is not receiving any data, since the harmonically down-converted version of the oscillating test signal might otherwise interfere with desired signal content within the signal band, and might be difficult to separate from the received signal. In such idle time intervals, the interface circuit 60 may be disconnected from the mixers 70 and 80 using optional switches among the switches 360. An advantage of instead selecting df to fall within the transition band 395 is that the harmonically down-converted version of the oscillating test signal does not interfere with desired signal content within the signal band, and thus the calibration may be performed simultaneously with the radio receiver circuit 10 receiving data.

Accordingly, according to some embodiments of the present invention, there is provided a a method of tuning the down-conversion circuit 30. The method comprises generating the oscillating test signal, for which the frequency df falls within the passband 390 or the transition band 395 of the CSF 370. The method further comprises injecting the oscillating test signal into the input ports of the first and second passive switching mixers 70, 80. Components of the passive output combiner network 90 are tuned by first tuning tunable resistors (such as the resistors 100a-b, 110a-b in FIG. 4) of the passive output combiner network 90 for determining a resistor tuning setting that minimizes the power contribution of the oscillating test signal at the output of the CSF 370 for a default setting of tunable capacitors (such as the capacitors 120, 130 in FIG. 4) of the passive output combiner network 90. For example, if the tunable components are digitally tunable components, a default control word (corresponding to said default setting) may be applied to the tunable capacitors. Then, the down-conversion circuit 30 may step through all possible control words for the tunable resistors while measuring the power contribution of the oscillating test signal at the output of the CSF 370, whereby the resistor tuning setting can be determined (in this case in the form of a control word for the tunable resistors) that minimizes the power contribution of the oscillating test signal at the output of the channel selection filter 370 for the default setting of the tunable capacitors. This measuring may e.g. be performed in the digital domain using the digital signal generated by the ADC 380. Thereafter, the tunable capacitors of the passive output combiner network 90 are tuned for determining a capacitor tuning setting that minimizes the power contribution of the oscillating test signal at the output of the CSF 370 for said determined setting of said tunable resistors of the passive output combiner network 90. For example, assuming again digitally tunable components, the above determined control word (corresponding to the resistor tuning setting that minimizes the power contribution of the oscillating test signal at the output of the channel selection filter 370 for the default setting of tunable capacitors) may be applied to the tunable resistors. Then, the down-conversion circuit 30 may step through all possible control words for the tunable capacitors while measuring the power contribution of the oscillating test signal at the output of the CSF 370, whereby the resistor tuning setting can be determined (in this case in the form of a control word for the tunable resistors) that minimizes the power contribution of the oscillating test signal at the output of the channel selection filter 370 for the above determined setting of the tunable resistors. Similarly to the above, this measuring may e.g. be performed in the digital domain using the digital signal generated by the ADC 380. The thereby determined resistor tuning setting capacitor tuning setting is then applied to the tunable resistors and the tunable capacitors, respectively.

Figure 12:
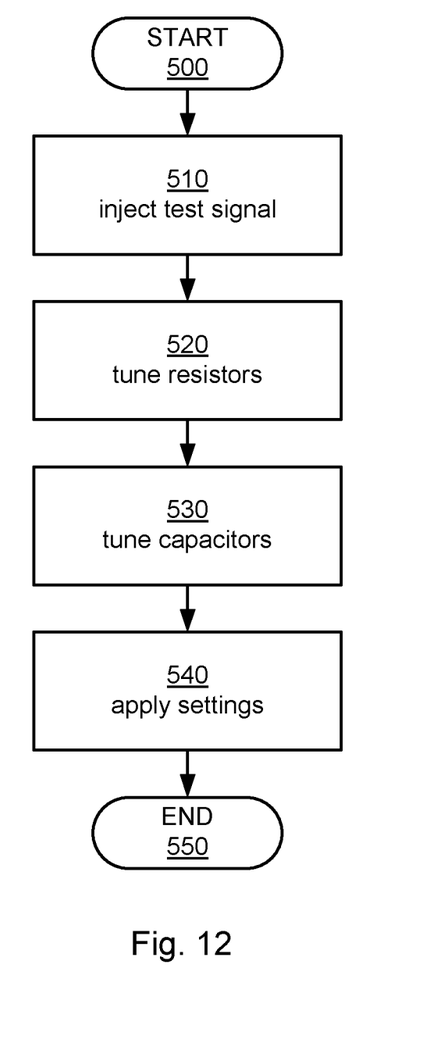
FIG. 12 is a flow-chart of a method of calibrating a down-conversion circuit according to some embodiments of the present invention.

FIG. 12 is a flowchart of the tuning method according to some embodiments of the present invention. Execution of the method is started in step 500. In step 510, the oscillating test signal is injected into the input ports of the first and the second passive switching mixers 70, 80. In step 520, the tunable resistors are tuned for a default tuning setting of the tunable capacitors, whereby a resistor tuning setting is determined. In step 530, the tunable capacitors are tuned for the determined tuning setting of the tunable resistors, whereby a capacitor tuning setting is determined. The determined resistor tuning setting and capacitor tuning setting are applied in step 540, and the execution of the method is ended in step 550. The method can be repeated as necessary to account for temporal variations such as temperature variations. It should be noted that, even though the flowchart in FIG. 12 is shown as steps performed in sequential order, step 510 is continued during steps 520 and 530, since the oscillating test signal is used for the tuning of the resistors and the capacitors.

The present invention has been described above with reference to specific embodiments. However, other embodiments than the above described are possible within the scope of the invention. Different method steps than those described above, performing the method by hardware or software, may be provided within the scope of the invention. The different features and steps of the embodiments may be combined in other combinations than those described. The scope of the invention is only limited by the appended patent claims.

The invention claimed is:

1. A down-conversion circuit for a receiver circuit, comprising:
   a first passive switching mixer arranged to down-convert a received radio frequency (RF) signal with a first local oscillator (LO) signal having a first duty cycle for generating a first down-converted signal at an output port of the first passive switching mixer;
   a second passive switching mixer arranged to down-convert the received RF signal with a second LO signal having the same LO frequency as the first LO signal and a second duty cycle, different from the first duty cycle, for generating a second down-converted signal at an output port of the second passive switching mixer; and
   a passive output combiner network operatively connected to the output ports of the first passive switching mixer and the second passive switching mixer and comprising an impedance network arranged to combine the first and the second down-converted signals such that harmonically down-converted signal content present in the first down-converted signal and harmonically down-converted signal content present in the second down-converted signal cancel in a combined output signal of the down-conversion circuit;

wherein:
   one or more impedance elements of the impedance network of the passive output combiner network are tunable to adjust magnitudes and phases of the first and the second down-converted signals;
   the first and the second down-converted signals are differential signals and the output port of the first passive switching mixer and the output port of the second passive switching mixer are both differential output ports, each having a first and a second output terminal; and
   wherein the impedance elements comprise:
      a first resistor directly connected between the first output terminal of the output port of the first passive switching mixer and a first summing node of the down-conversion circuit;
      a second resistor directly connected between the first output terminal of the output port of the second passive switching mixer and the first summing node of the down-conversion circuit;
      a first capacitor directly connected across the first and second output terminals of the first passive switching mixer; and
      a second capacitor directly connected across the first and second output terminals of the second passive switching mixer.

2. The down-conversion circuit according to claim 1, wherein the first duty cycle is 25% and the second duty cycle is 50%.

3. The down-conversion circuit according to claim 1, wherein said harmonically down-converted signal content present in the first down-converted signal and said harmonically down-converted signal content present in the second down-converted signal that cancel in the combined output signal comprises signal content down-converted by 3rd and 5th harmonics of the first LO signal and signal content down converted by 3rd and 5th harmonics of the second LO signal, respectively.

4. The down-conversion circuit according to claim 1, wherein the down-conversion circuit is arranged to perform frequency-translated filtering.

5. The down-conversion circuit according to claim 1, comprising a first low-noise amplifier (LNA) arranged to supply the received RF signal to an input port of the first passive switching mixer and a separate second LNA arranged to supply the received RF signal to an input port of the second passive switching mixer.

6. The down-conversion circuit according to claim 5, wherein the first LNA has a common gate topology and the second LNA has a common source topology.

7. The down-conversion circuit according to claim 5, wherein the first and second LNA are tunable to adjust magnitudes and phases of the first and the second down-converted signals.

8. A quadrature down-conversion circuit for a receiver circuit, wherein the quadrature down-conversion circuit comprises a first and a second down-conversion circuit according to claim 1 arranged in an in-phase (I) signal path and a quadrature-phase (Q) signal path, respectively, of the quadrature down-conversion circuit.

9. The quadrature down-conversion circuit according to claim 8, wherein the first passive switching mixer of the first down-conversion circuit and the first passive switching mixer of the second down-conversion circuit share a common input port.

10. A receiver circuit comprising the quadrature down-conversion circuit according to claim 8.

11. A receiver circuit comprising the down-conversion circuit according to claim 1.

12. A communication device comprising the radio receiver circuit according to claim 11.

13. The communication device according to claim 12, wherein the communication device is a wireless communication device.

14. The communication device according to claim 13, wherein the wireless communication device is a radio base station, a mobile phone or a wireless data modem.

15. The communication device according to claim 13, wherein the communication device is a wireline communication device.

\* \* \* \* \*